(12) United States Patent
Yang et al.

(10) Patent No.: US 11,314,914 B2
(45) Date of Patent: Apr. 26, 2022

(54) METHOD AND NON-TRANSITORY COMPUTER READABLE MEDIUM OF OPERATING AN ELECTRONIC DESIGN AUTOMATION PLATFORM FOR AN OPTIMAL INTGRATED CIRCUIT DESIGN

(71) Applicant: TAIWAN SEMICONDUCTOR MANUFACTURING CO., LTD., Hsinchu (TW)

(72) Inventors: Tsun-Yu Yang, Changhua County (TW); Ren-Hong Fu, Taipei (TW); Chin-Cheng Kuo, Taoyuan (TW); Jui-Feng Kuan, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/693,027

(22) Filed: Nov. 22, 2019

(65) Prior Publication Data
US 2020/0175219 A1 Jun. 4, 2020

Related U.S. Application Data

(60) Provisional application No. 62/773,004, filed on Nov. 29, 2018.

(51) Int. Cl.
*G06F 30/392* (2020.01)
*G06F 30/31* (2020.01)
*G06F 30/3308* (2020.01)

(52) U.S. Cl.
CPC ............ *G06F 30/392* (2020.01); *G06F 30/31* (2020.01); *G06F 30/3308* (2020.01)

(58) Field of Classification Search
CPC ........ G06F 30/392; G06F 30/31; G06F 30/33; G06F 30/398; G06F 30/20; G06F 30/3308; G06F 30/36
See application file for complete search history.

(56) References Cited

U.S. PATENT DOCUMENTS

| | | | | | |
|---|---|---|---|---|---|
| 5,301,318 | A | * | 4/1994 | Mittal | ..................... G06F 30/33 716/103 |
| 5,487,018 | A | * | 1/1996 | Loos | ....................... G06F 30/30 716/102 |
| 5,802,349 | A | * | 9/1998 | Rigg | ....................... G06F 30/30 716/103 |
| 6,216,252 | B1 | * | 4/2001 | Dangelo | .................. G06F 30/30 716/102 |
| 6,219,822 | B1 | * | 4/2001 | Gristede | ............... G06F 30/327 716/113 |
| 6,857,110 | B1 | * | 2/2005 | Rupp | ....................... G06F 30/30 716/136 |
| 7,089,512 | B2 | * | 8/2006 | Iadanza | .................. G06F 30/367 716/102 |
| 7,337,420 | B2 | * | 2/2008 | Chidambarrao | ........ G06F 30/39 716/112 |

(Continued)

*Primary Examiner* — Helen Rossoshek
(74) *Attorney, Agent, or Firm* — Maschoff Brennan

(57) ABSTRACT

A method is disclosed herein. The method includes: adjusting first parameters associated with parameterized cells in a netlist of an integrated circuit (IC) to generate second parameters associated with the parameterized cells in the netlist of the IC; updating the netlist of the IC according to the second parameters; and performing a simulation according to the netlist.

20 Claims, 12 Drawing Sheets

(56) References Cited

U.S. PATENT DOCUMENTS

| | | | | |
|---|---|---|---|---|
| 7,356,784 B1* | 4/2008 | Dengi | G06F 30/367 | 716/113 |
| 7,418,683 B1* | 8/2008 | Sonnard | G06F 30/398 | 716/122 |
| 7,895,544 B2* | 2/2011 | Amundson | G06F 30/392 | 716/119 |
| 8,453,102 B1* | 5/2013 | Pack | G06F 30/327 | 716/139 |
| 8,516,428 B2* | 8/2013 | Bowers | G06F 30/327 | 716/132 |
| 8,527,257 B2* | 9/2013 | Reddy | G06F 30/367 | 703/15 |
| 8,621,409 B2* | 12/2013 | Lee | G06F 30/367 | 716/119 |
| 8,856,701 B1* | 10/2014 | Chen | G06F 30/398 | 716/102 |
| 8,943,455 B2* | 1/2015 | Chen | G06F 30/398 | 716/119 |
| 9,015,016 B2* | 4/2015 | Lorenz | G06F 30/20 | 703/7 |
| 9,122,833 B2* | 9/2015 | Chen | G06F 30/367 | |
| 9,245,078 B2* | 1/2016 | Huang | G06F 30/392 | |
| 9,667,425 B2* | 5/2017 | Goss | G06F 12/0246 | |
| 9,690,893 B1* | 6/2017 | Ferguson | G06F 30/392 | |
| 9,697,162 B1* | 7/2017 | Mattela | G06F 1/266 | |
| 9,753,895 B2* | 9/2017 | Kuo | G06F 30/367 | |
| 9,798,840 B1* | 10/2017 | Ginetti | G06F 30/20 | |
| 10,078,715 B2* | 9/2018 | Sendig | G06F 30/392 | |
| 10,275,553 B2* | 4/2019 | Sundaresan | G06F 30/33 | |
| 10,706,206 B1* | 7/2020 | Kabir | G06F 30/33 | |
| 10,783,292 B1* | 9/2020 | Clewes | G06F 30/327 | |
| 10,808,333 B2* | 10/2020 | Ito | G06F 30/327 | |
| 10,970,441 B1* | 4/2021 | Zhang | G06F 30/327 | |
| 2005/0251766 A1* | 11/2005 | Shah | G06F 30/33 | 716/102 |
| 2006/0095824 A1* | 5/2006 | McGrath | G06F 11/261 | 714/741 |
| 2013/0144589 A1* | 6/2013 | Levi | G06F 30/327 | 703/14 |
| 2014/0129202 A1* | 5/2014 | Sadigh | G06F 30/327 | 703/14 |
| 2016/0125115 A1* | 5/2016 | Strang | G06F 30/30 | 716/116 |
| 2016/0232264 A1* | 8/2016 | Oh | G06F 30/30 | |
| 2016/0253445 A1* | 9/2016 | Pataky | G06F 30/33 | 716/104 |
| 2016/0335387 A1* | 11/2016 | Moroz | G06F 30/392 | |
| 2017/0161425 A1* | 6/2017 | DeHond | G06F 30/367 | |
| 2018/0260506 A1* | 9/2018 | Wood | G06F 30/33 | |

* cited by examiner

METHOD AND NON-TRANSITORY COMPUTER READABLE MEDIUM OF OPERATING AN ELECTRONIC DESIGN AUTOMATION PLATFORM FOR AN OPTIMAL INTGRATED CIRCUIT DESIGN

RELATED APPLICATIONS

This application claims priority to U.S. Provisional Application Ser. No. 62/773,004, filed Nov. 29, 2018, which is herein incorporated by reference.

BACKGROUND

An integrated circuit (IC) generally includes a plurality of semiconductor devices represented in an IC layout diagram. The IC layout diagram is generated from an IC schematic, for example, an electrical diagram of the IC. At various steps during the IC design process, from the IC schematic to the IC layout diagram for actual manufacture of the IC, various checking and testing are performed to make sure that the IC can be made and will function as designed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
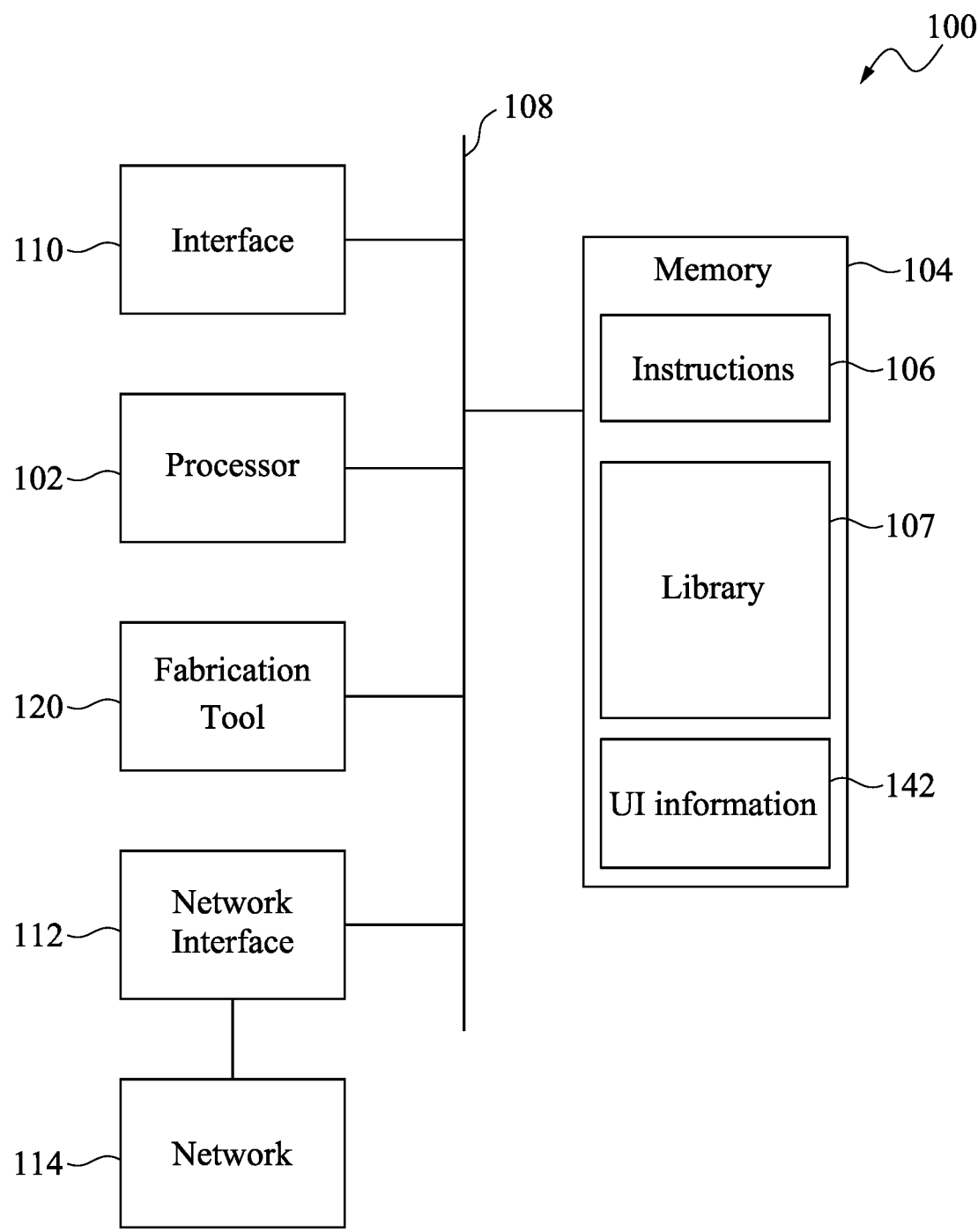
FIG. 1 is a block diagram of an EDA system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Reference is now made to FIG. 1. FIG. 1 is a schematic diagram of a system in accordance with various embodiments of the present disclosure.

FIG. 1 is a block diagram of an EDA system 100 in accordance with some embodiments. In some embodiments, the EDA system 100 includes an automated placement and routing (APR) system.

In some embodiments, the EDA system 100 is a general purpose computing device including a processor 102 and a non-transitory computer-readable storage medium 104. The non-transitory computer-readable storage medium 104, amongst other things, is encoded with, i.e., stores, computer program code 106, i.e., a set of executable instructions. Execution of instructions 106 by the processor 102 is regard as an EDA tool which implements a portion or all of, i.e., the methods described herein in accordance with some embodiments (hereinafter, the noted processes and/or methods).

The processor 102 is electrically coupled to the computer-readable storage medium 104 via a bus 108. The processor 102 is also electrically coupled to an I/O interface 110 by the bus 108. A network interface 112 is electrically connected to the processor 102 through the bus 108. The network interface 112 is connected to network 114, so that the processor 102 and the computer-readable storage medium 104 are capable of connecting to external elements through the network 114. The processor 102 is configured to execute the instructions 106 encoded in the computer-readable storage medium 104 in order to cause the EDA system 100 to perform a portion or all of the noted processes and/or methods. In some embodiments, the processor 102 is a central processing unit (CPU), a multi-processor, a distributed processing system, an application specific integrated circuit (ASIC), and/or a suitable processing unit.

In some embodiments, the computer-readable storage medium 104 is an electronic, a magnetic, an optical, an electromagnetic, an infrared, and/or a semiconductor system (or apparatus or device). For example, the computer-readable storage medium 104 includes a semiconductor or solid-state memory, a magnetic tape, a removable computer diskette, a random access memory (RAM), a read-only memory (ROM), a rigid magnetic disk, and/or an optical disk. In some embodiments, when using optical disks, the computer-readable storage medium 104 includes a compact disk-read only memory (CD-ROM), a compact disk-read/write (CD-R/W), and/or a digital video disc (DVD).

In some embodiments, the computer-readable storage medium 104 stores the instructions 106 for causing the EDA system 100 (where such execution represents (at least in part) the EDA tool) to perform a part or all of the noted processes and/or methods. In some embodiments, the computer-readable storage medium 104 also stores information which facilitates performing a part or all of the noted processes and/or methods. In some embodiments, the computer-readable storage medium 104 stores a library 107 of standard cells.

The EDA system 100 includes an I/O interface 110. In some embodiments, the I/O interface 110 includes an input device, an output device and/or a combined input/output device for enabling a user and/or external circuitry/equipment to interact with the EDA system 100. An input device includes, for example, a keyboard, a keypad, a mouse, a trackball, a trackpad, a touchscreen, and/or a cursor direction keys for communicating information and commands to the processor 102. An output device includes, for example, a display, a printer, a voice synthesizer, etc. for communicating information to a user.

The EDA system 100 also includes a network interface 112 coupled to the processor 102. The network interface 112 allows the EDA system 100 to communicate with a network 114, to which one or more other computer systems are connected. The network interface 112 includes wireless network interfaces such as BLUETOOTH, WIFI, WIMAX, GPRS, or WCDMA; or wired network interfaces such as ETHERNET, USB, or IEEE-1364. In some embodiments, a part or all of noted processes and/or methods, is implemented in two or more EDA systems 100.

The EDA system 100 is configured to receive information through the I/O interface 110. The information received through I/O interface 110 includes one or more of instructions, data, design rules, libraries of standard cells, and/or other parameters for processing by the processor 102. The information is transferred to the processor 102 via the bus 108. The EDA system 100 is configured to output to and/or receive information from a user through a user interface (UI). The UI includes the I/O interface 110 and information related to UI stored in the computer-readable medium 104 as UI information 142.

In some embodiments, the computer-readable storage medium 104 is also encoded with instructions 106 for interfacing with fabrication tools 120 including, for example, manufacturing equipments, chambers, or the like. For illustration, the fabrication tools 120 are configured for producing IC, in some embodiments, based on layouts.

In some embodiments, the fabrication tools 120 perform various semiconductor processes including, for example, generating photomasks based on layouts, fabricating using the photomasks, etching, deposition, implantation, and annealing. The fabrication tools 120 include, for example, photolithography steppers, etch tools, deposition tools, polishing tools, rapid thermal anneal tools, ion implantation tools, and the like. Each fabrication tool 120 modifies the wafer according to a particular operating recipe. For illustration, one fabrication tool 120 is configured to deposit a film having a certain thickness on a wafer, and another fabrication tool 120 is configured to etch away a layer from a wafer. Furthermore, in some embodiments, the fabrication tools 120 of the same type are designed to perform the same type of process.

In some embodiments, a part or all of the noted processes and/or methods is implemented as a standalone software application for execution by a processor. In some embodiments, a part or all of the noted processes and/or methods is implemented as a software application that is a part of an additional software application. In some embodiments, a part or all of the noted processes and/or methods is implemented as a plug-in to a software application. In some embodiments, at least one of the noted processes and/or methods is implemented as a software application that is a part of an EDA tool. In some embodiments, a part or all of the noted processes and/or methods is implemented as a software application that is used by the EDA system 100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, i.e., one or more of an optical disk, such as a DVD, a magnetic disk, such as a hard disk, a semiconductor memory, such as a ROM, a RAM, a memory card, and the like. In some embodiments, the terms "comprise," "comprising," "include," "including," "has," "having," etc. used in this specification are open-ended and mean "comprises but not limited".

Figure 2:
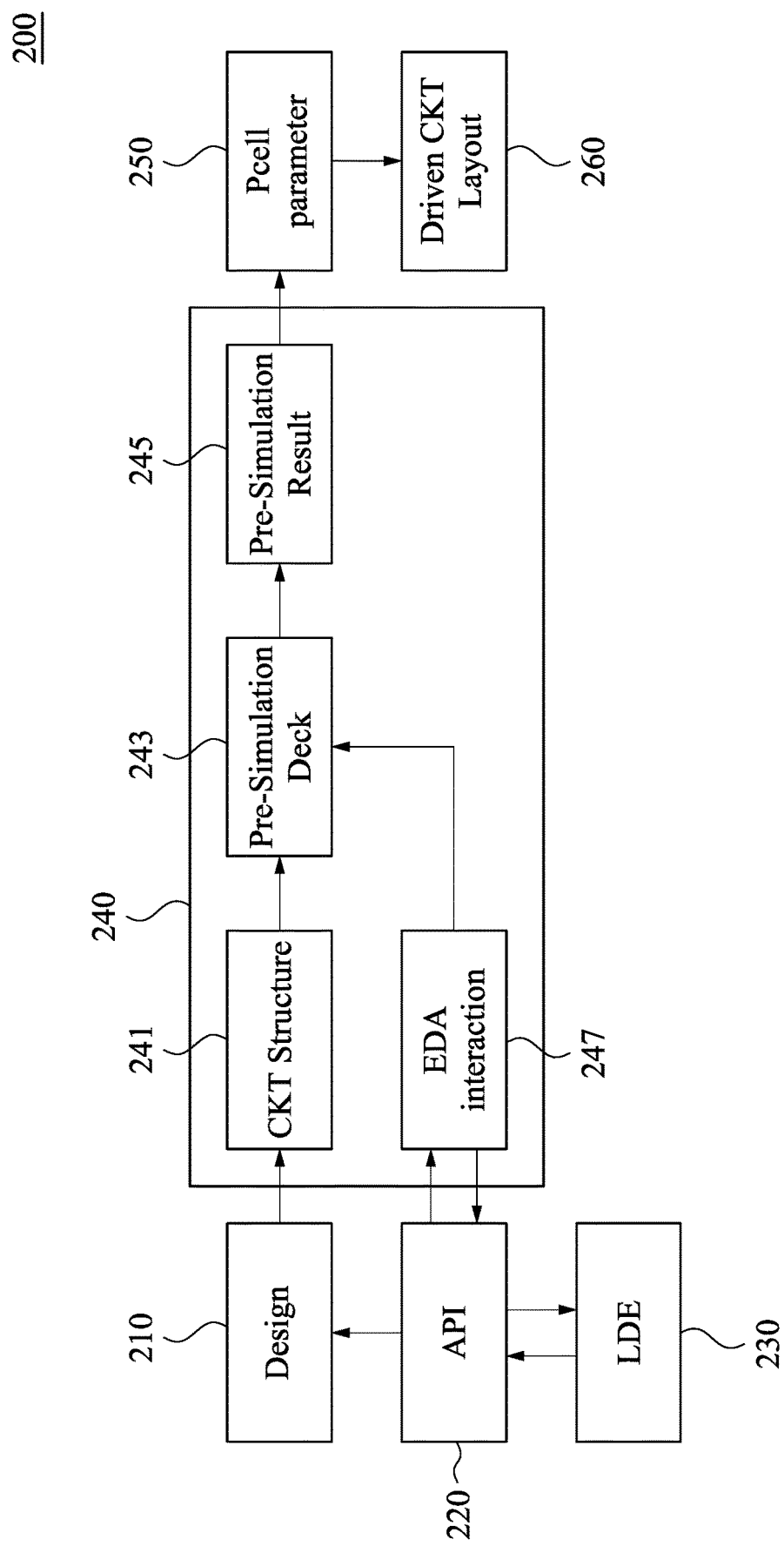
FIG. 2 is an operation diagram of an EDA platform system in accordance with some embodiments.

FIG. 2 is an operation diagram of an EDA platform system in accordance with some embodiments. As illustratively shown in FIG. 2, the EDA platform system 200 is implemented by the processor 102 as illustratively shown in FIG. 1 to execute the instructions 106. The operation blocks marked as 210, 220, 230, 240, 250 and 260 are used to describe the operations that performed by the EDA platform system 200 for facilitating the understanding of the operations of the EDA platform system 200.

In some embodiments, a netlist of an integrated circuits (IC) is able to be stored in the computer-readable storage medium 104 as illustratively shown in FIG. 1. The netlist of the IC which is stored in the computer-readable storage medium 104 includes a plurality of designs with a plurality of initial parameters associated with parameterized cells (PCells) in the netlist of the IC. When a simulation needs to be executed, an operation 210 is performed to provide a design with PCells, and an operation 241 is performed to further adjust a detailed circuit structure of the design with PCells. For example, dimensions and connections of elements in the circuit are further adjusted to be more suitable for the simulation. Meanwhile, when the simulation needs to be executed, an operation 247 is also performed to execute an EDA interaction, and the EDA interaction therefore triggers an operation 220 such that an API is executed to adjust initial parameters of the PCells in the netlist of the IC.

Figure 3:
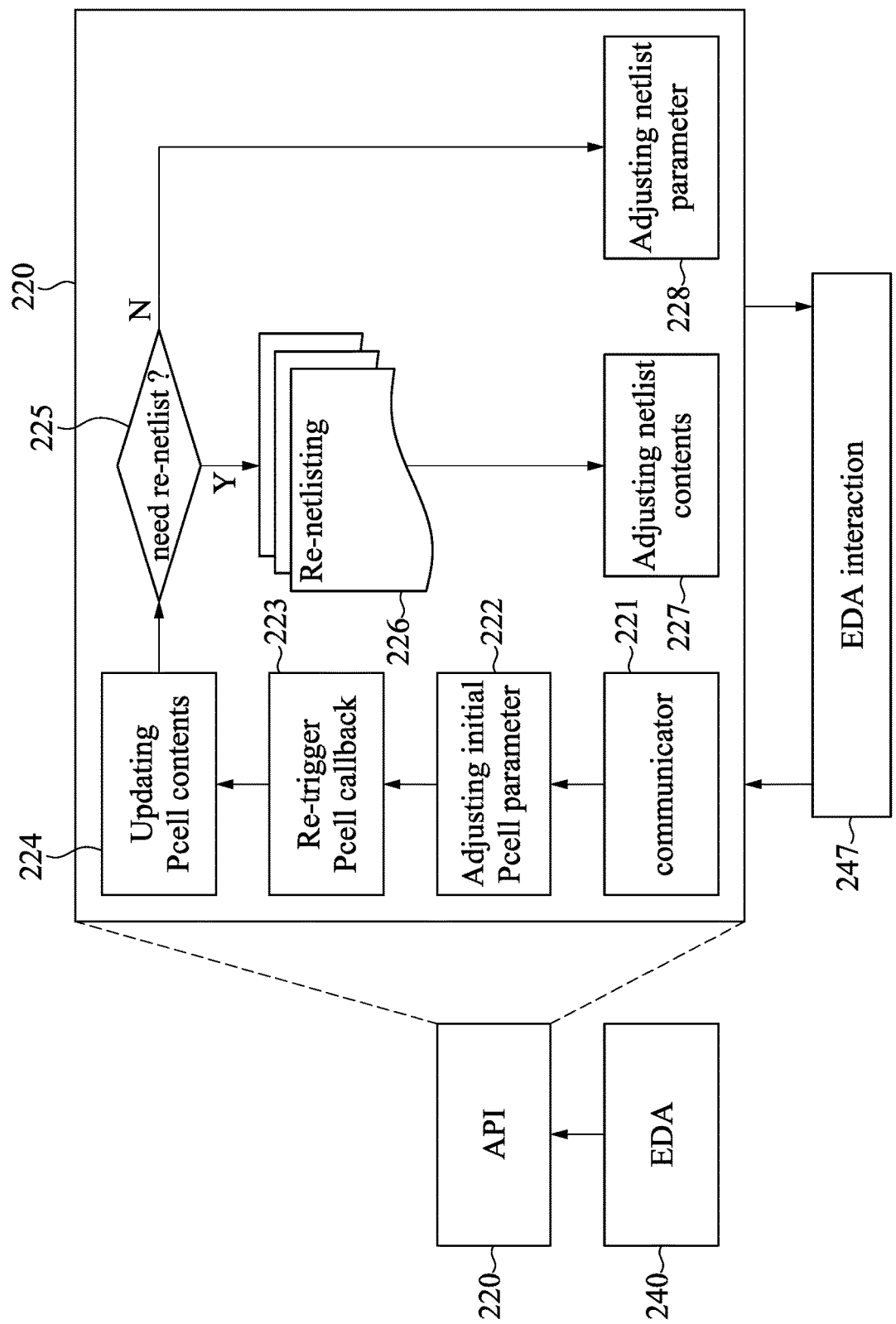
FIG. 3 is a detail operation diagram of the operations as shown in FIG. 2 in accordance with various embodiments of the present disclosure.

For understanding the operation 220 in FIG. 2, reference is now made to FIG. 3, which is a detail operation diagram of the operation 220 as illustratively shown in FIG. 2, in accordance with various embodiments of the present disclosure.

As illustratively shown in FIG. 3, when the simulation needs to be executed, the operation 247 is performed to execute the EDA interaction, and the EDA interaction then triggers the operation 220, by an operation 221 to execute a communicator, such that an operation 222 is performed to adjust initial parameters of the PCells in the netlist of the IC. When the initial parameters of the PCells in the netlist of the IC are adjusted, the operation 223 is performed to re-trigger PCell callback for obtaining Layout Dependence Effect (LDE) and other factors, which are related to performance correspond to the adjusted parameters of the PCells in the netlist of the IC, from an operation 230 as shown in FIG. 2. In some embodiments, the operation 230 as shown in FIG. 2 is performed to obtain LDE and other factors which are stored in the computer-readable storage medium 104 as illustratively shown in FIG. 1.

Reference is now made to FIG. 3, the callback LDE and other factors together with the adjusted parameters will be transmitted to the operation 223, and the API is therefore executed to update the PCells in the netlist of the IC as illustratively shown in an operation 224. Thereafter, an operation 225 is performed to determine whether the updated PCells in the netlist of the IC needs to be re-netlisted. If the updated PCells in the netlist of the IC needs to be re-netlisted, an operation 226 is performed to re-netlist the netlist of the IC, and an operation 227 is then performed to adjust the entire contents of the netlist of the IC. In the contrary, if the updated PCells in the netlist of the IC do not need to be re-netlisted, an operation 228 is performed to merely adjust the parameters of the PCells. Subsequently, the operation 247 is performed to execute the EDA interaction to receive the content-adjusted netlist or the parameter-adjusted netlist from the operation 220, for example, from the operation 227 or from the operation 228, and provide the same to the following operation 243 as illustratively shown in FIG. 2 to execute a pre-simulation deck.

Reference is now made to FIG. 2, the pre-simulation deck then performs the simulation according to the content-adjusted netlist or the parameter-adjusted netlist, and provides a pre-simulation result to the following operation 245. The above-mentioned operations 210-240, including the operations 241, 243, 245, 247, are going to be performed several times, and there are a plurality of pre-simulation results. The operation 245 is therefore performed to provide the best pre-simulation result to the following operation 250 to annotate optimal PCell parameters for the following operation 260 to drive optimal CKT layouts.

Figure 4:
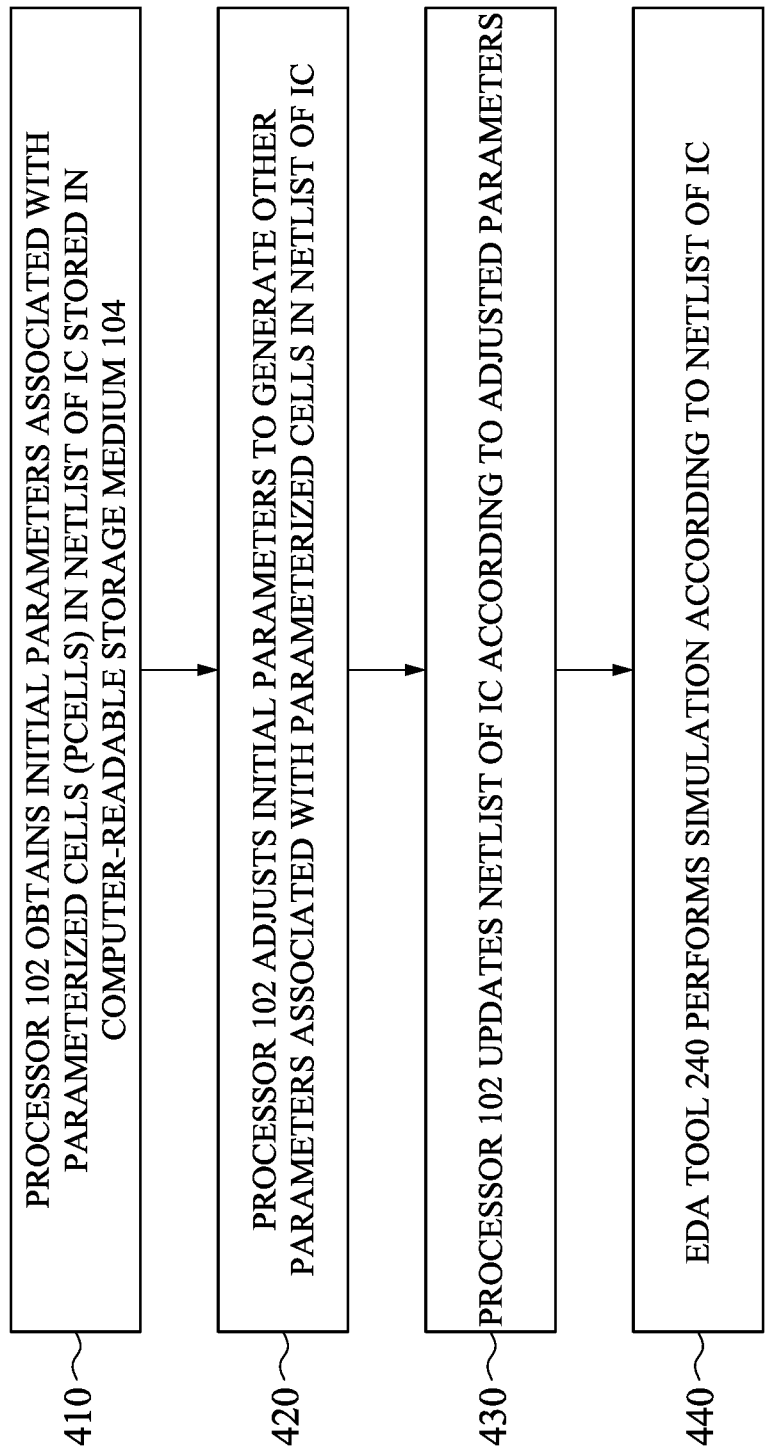
FIG. 4 is a flow chart of a method for operating an EDA system in accordance with various embodiments of the present disclosure.

Reference is now made to FIG. 4. FIG. 4 is a flow chart of a method 400 for operating the EDA system 100 as illustratively shown in FIG. 1 in accordance with various embodiments of the present disclosure.

As illustratively shown in FIG. 4, in operation 410, the processor 102 in FIG. 1 obtains the initial parameters associated with parameterized cells (PCells) in the netlist of the IC stored in the computer-readable storage medium 104.

In operation 420, the processor 102 in FIG. 1 adjusts the initial parameters associated with the parameterized cells in the netlist of the IC to generate other parameters associated with the parameterized cells in the netlist of the IC.

As illustratively shown in FIG. 4, in operation 430, the processor 102 in FIG. 1 updates the netlist of the IC according to the adjusted parameters associated with the parameterized cells in the netlist of the IC.

In operation 440, the processor 102 in FIG. 1 performs a simulation according to the netlist of the IC.

Figure 5:
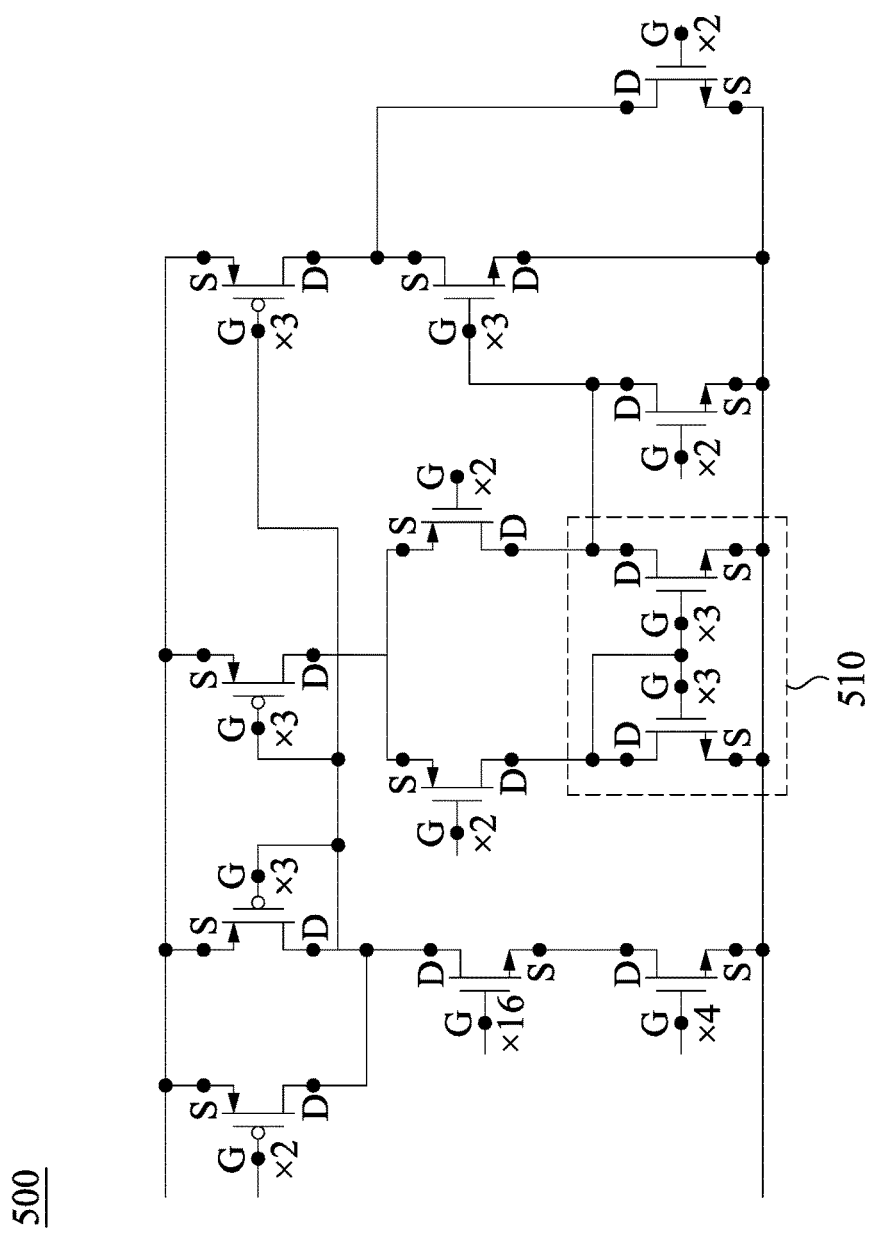
FIG. 5 is a schematic diagram of elements of a circuit in a netlist of an integrated circuit (IC) in accordance with various embodiments of the present disclosure.

For understanding the parameters associated with the parameterized cells in the netlist of the IC, reference is now made to FIG. 5. FIG. 5 is a schematic diagram of elements of a circuit in the netlist of the IC in accordance with various embodiments of the present disclosure.

As illustratively shown in FIG. 5, the circuit 500 includes a plurality of elements, for example, a plurality of transistors. The elements in the circuit 500 are electrically connected together. For instance, part of the elements in the circuit 500 are electrically connected in parallel, part of the elements in the circuit 500 are electrically connected in series, and part of the elements in the circuit 500 are electrically connected in any other suitable form depending on actual requirements.

In some embodiments, the elements in the circuit 500 are parameterized cell (PCell). PCell is more flexible than non-parameterized cell because different implementations have different parameters, and different structures in the circuit are therefore generated. For example, rather than having many different cell definitions to represent variously sized transistors in a given design, a PCell takes dimensions (i.e., width and length) of a transistor as parameters. Different implementations of a PCell therefore represent transistors with different sizes. Hence, the design of the circuit 500 in the netlist of the IC is able to be adjusted easily by adopting PCells.

Figure 6:
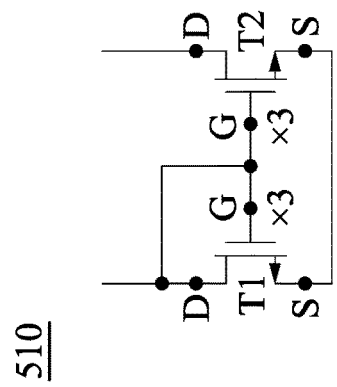
FIG. 6 is a schematic diagram of part of the elements as illustrated in FIG. 5 of the circuit in the netlist of the IC in accordance with various embodiments of the present disclosure.

FIG. 6 is a schematic diagram of part of the elements in the circuit 500 as illustrated in FIG. 5 of the circuit in the netlist of the IC in accordance with various embodiments of the present disclosure.

As illustratively shown in FIG. 6, the circuit 510 is part of the circuit 500 in FIG. 5. The element T1 in FIG. 6 is, for example, a PCell transistor. The symbol "×3" at the terminal G of the PCell transistor T1 as illustratively shown in FIG. 6 represents the stacked number of the PCell transistor T1 is 3. The arrow symbol represents the type of the PCell transistor T1. The type of the PCell transistor T1 as illustratively shown in FIG. 6 is, for example, a N-type transistor. However, the type of the PCell transistor T1 as illustratively shown in FIG. 6 is not intended to limit the scope of the present disclosure, the type of the PCell transistor T1 is, for example, a P-type transistor depending on actual requirements. The above-mentioned symbols of the PCell transistor are parameterized into parameters. In addition, the dimensions (i.e., width and length) of the PCell transistor are also parameterized into parameters. Those parameters are written into the netlist of the IC, and stored in the computer-readable storage medium 104 as illustratively shown in FIG. 1. When performing a simulation, the parameters which represent the dimensions and the structures of the PCell transistor are used to restructure a circuit. Since the elements in the circuit 510 are parameterized into parameters, the simulation is facilitated by adjusting the parameters easily to restructure the circuit. Therefore, the best result of the simulation is found faster.

Figure 9:
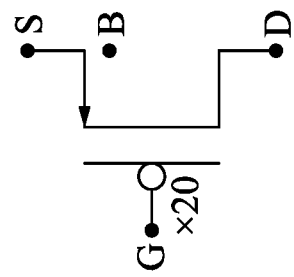
FIG. 9 is a schematic diagram of the elements as illustrated in FIG. 5 and FIG. 6 of the circuit in the netlist of the IC in accordance with various embodiments of the present disclosure.
Figure 8:
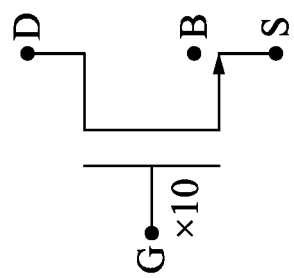
FIG. 8 is a schematic diagram of the elements as illustrated in FIG. 5 and FIG. 6 of the circuit in the netlist of the IC in accordance with various embodiments of the present disclosure.
Figure 7:
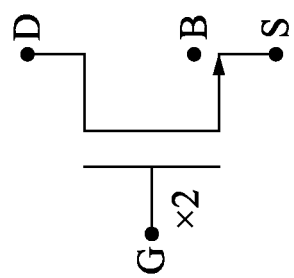
FIG. 7 is a schematic diagram of the elements as illustrated in FIG. 5 and FIG. 6 of the circuit in the netlist of the IC in accordance with various embodiments of the present disclosure.

FIGS. 7-9 are schematic diagrams of the elements in the circuit 500 as illustratively shown in FIG. 5 and FIG. 6 in accordance with various embodiments of the present disclosure. FIGS. 7-9 illustrate different embodiments of symbols of the PCell transistors for further facilitating the understanding of the PCell transistors.

As illustratively shown in FIG. 7, the symbol "×2" at the terminal G of the PCell transistor represents the stacked number of the PCell transistor is 2. The arrow symbol as illustratively shown in FIG. 7 represents the type of the PCell transistor, and the type of the PCell transistor is, for example, a N-type transistor. As illustratively shown in FIG. 8, the symbol "×10" at the terminal G of the PCell transistor represents the stacked number of the PCell transistor is 10. The arrow symbol as illustratively shown in FIG. 8 represents the type of the PCell transistor, and the type of the PCell transistor is, for example, a N-type transistor. As illustratively shown in FIG. 9, the symbol "×20" at the terminal G of the PCell transistor represents the stacked number of the PCell transistor is 20. The arrow symbol as illustratively shown in FIG. 9 represents the type of the PCell transistor, and the type of the PCell transistor is, for example, a P-type transistor. The above-mentioned symbols of the PCell transistors as illustratively shown in FIG. 7 to FIG. 9 are parameterized into parameters. Those parameters are written into the netlist of the IC, and stored in the computer-readable storage medium 104 as illustratively shown in FIG. 1. Since it is easy to adjust parameters to restructure the circuit in the netlist of the IC, the simulation is facilitated and the best result of the simulation is found faster.

Figure 11:
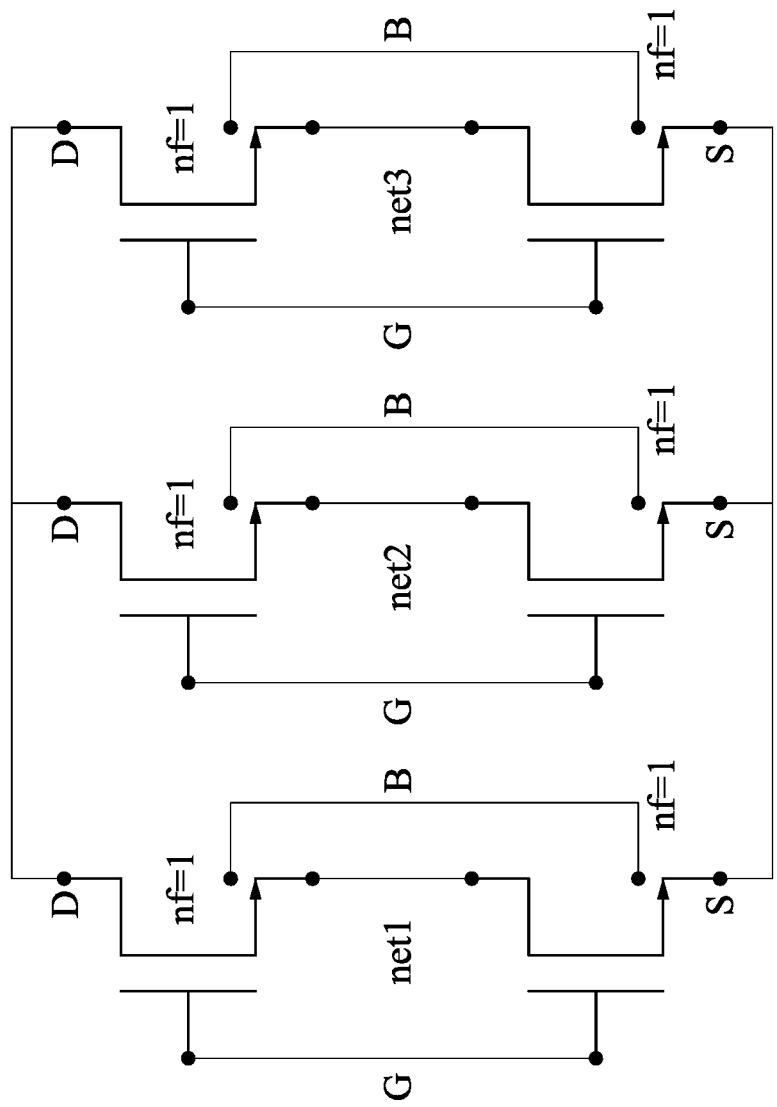
FIG. 11 is a schematic diagram of the structure as illustrated in FIG. 5 of the circuit in the netlist of the IC in accordance with various embodiments of the present disclosure.
Figure 10:
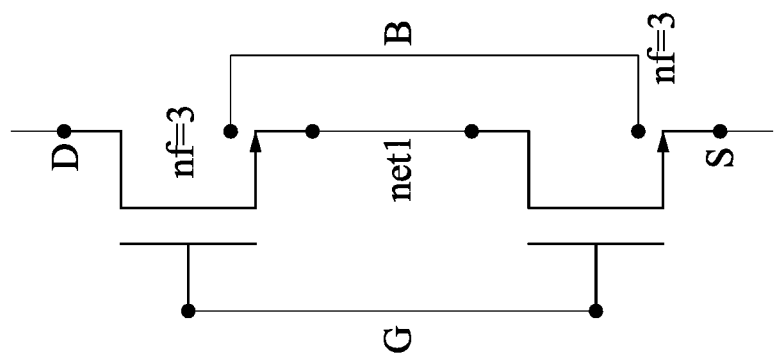
FIG. 10 is a schematic diagram of the structure as illustrated in FIG. 5 of the circuit in the netlist of the IC in accordance with various embodiments of the present disclosure.

FIGS. 10-11 are schematic diagrams of the structure in the circuit 500 as illustratively shown in FIG. 5 in accordance with various embodiments of the present disclosure. FIGS. 10-11 illustrate different embodiments of structure of the PCell transistors for further facilitating the understanding of the PCell transistors.

As illustratively shown in FIG. 10, the symbol "nf=3" at the terminal B of each of the PCell transistors represents that the PCell transistors are connected to each other in parallel, and the number of the connected PCell transistors is 3. Explained in a different way, there are three PCell transistors which are connected to each other in parallel as illustratively shown in FIG. 10. In addition, terminals B of two of the PCell transistors as illustratively shown in FIG. 10 are connected together, and terminals G of two of the PCell transistors are connected together. As illustratively shown in FIG. 11, the symbol "nf=1" at the terminal B of each of the PCell transistors represent that the number of each of the PCell transistors is 1. There are three set of circuits as illustratively shown in FIG. 11, each set of the circuits includes an upper PCell transistor and an lower PCell transistor whose terminals B are connected together and terminals G are connected together. In addition, terminals D of the upper PCell transistors of each set of the circuits are connected together, and terminals S of the lower PCell transistors of each set of the circuits are connected together. The above-mentioned structures of the PCell transistors are also parameterized into parameters. Those parameters are written into the netlist of the IC, and stored in the computer-readable storage medium 104 as illustratively shown in FIG. 1. Since it is easy to adjust parameters to restructure the circuit in the netlist of the IC, the simulation is facilitated and the best result of the simulation is found faster.

Figure 12:
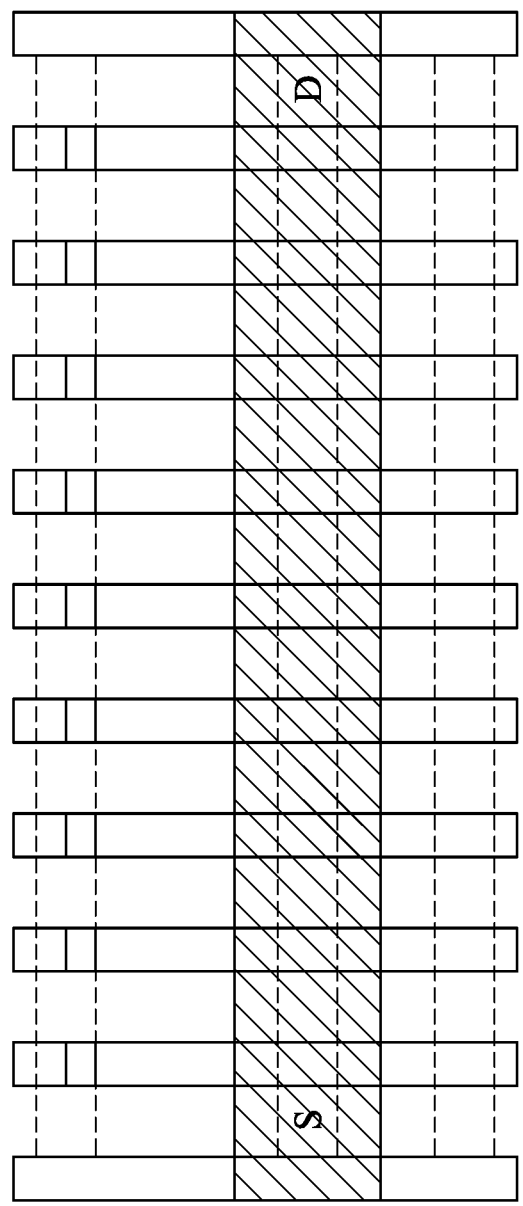
FIG. 12 is a schematic diagram of a structure of a circuit in a netlist of an IC in accordance with various embodiments of the present disclosure.
Figure 13:
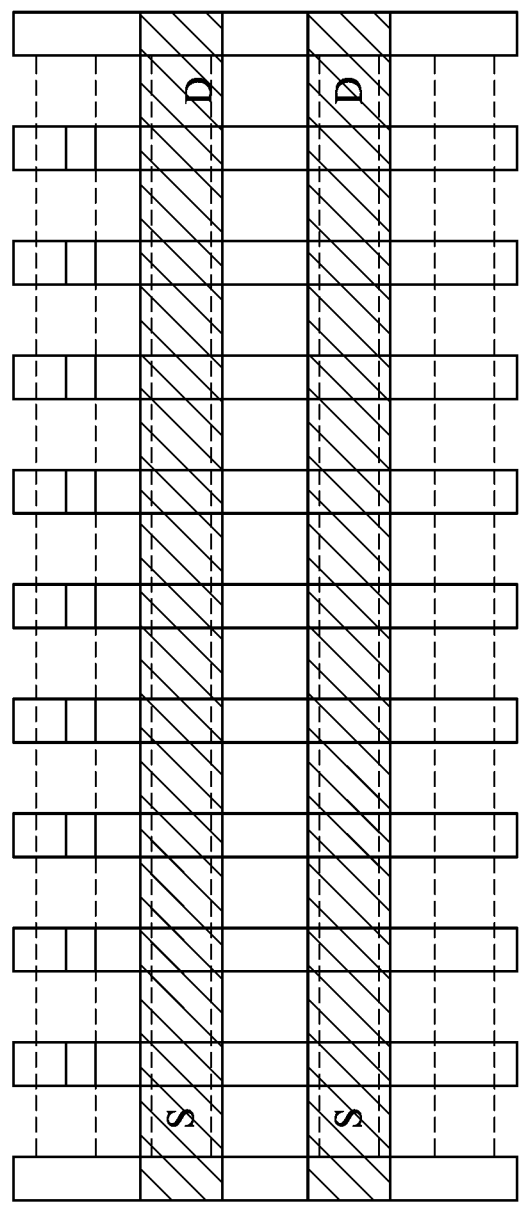
FIG. 13 is a schematic diagram of a structure of a circuit in a netlist of an IC in accordance with various embodiments of the present disclosure.

FIG. 12 is a schematic diagram of a structure of a circuit in a netlist of an IC in accordance with various embodiments of the present disclosure. FIG. 13 is a schematic diagram of a structure of a circuit in a netlist of an IC in accordance with various embodiments of the present disclosure.

As illustratively shown in FIG. 12, it is a top view of a semiconductor structure of the circuit in the netlist of the IC. As shown in FIG. 12, the semiconductor structure of the circuit in the netlist of the IC includes a first terminal, for example, a source of a Metal-Oxide-Semiconductor Field Effect Transistor (MOSFET), and a second terminal, for example, a drain of the MOSFET. In some embodiments, the semiconductor structure as illustratively shown in FIG. 12 merely includes one active area, for example, one source and one drain. However, the present disclosure is not intended to be limited to the embodiment as illustratively shown in FIG. 12. In some embodiments, the semiconductor structure in FIG. 13 includes two first terminals, for example, two sources of the MOSFETs, and two second terminals, for example, two drains of the MOSFETs as illustratively shown in FIG. 13 depending on actual requirements. In some embodiments, the semiconductor structure as illustratively shown in FIG. 13 includes two active areas, for example, two sources and two drains. In some embodiments, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

In order to let the semiconductor structure as illustratively shown in FIG. 12 and the semiconductor structure as illustratively shown in FIG. 13 have the same performance, the width of the semiconductor structure as illustratively shown in FIG. 12 with one active area is larger than each of the widths in the semiconductor structures as illustratively shown in FIG. 13 with two active areas.

Figure 14:
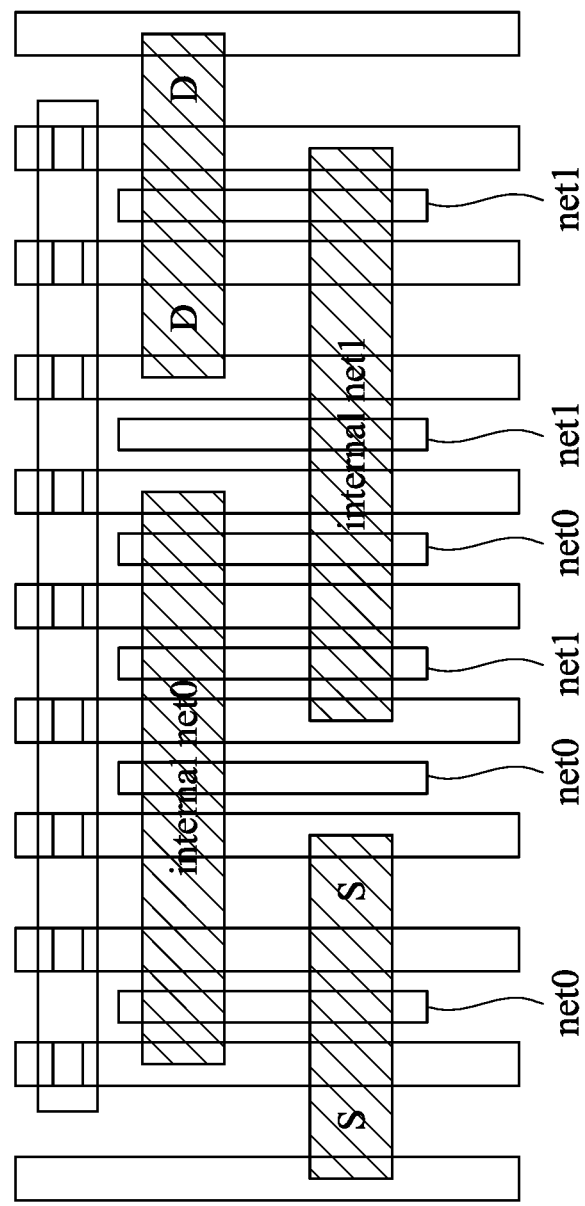
FIG. 14 is a schematic diagram of a layout of the circuit in the netlist of the IC as illustrated in FIG. 10 in accordance with various embodiments of the present disclosure.
Figure 15:
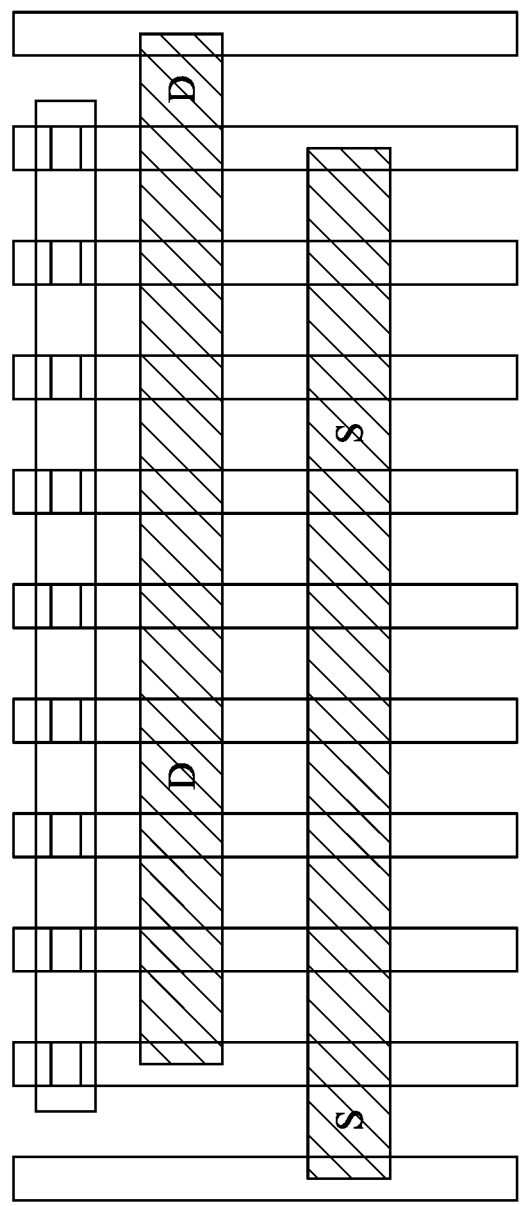
FIG. 15 is a schematic diagram of a layout of the circuit in the netlist of the IC as illustrated in FIG. 11 in accordance with various embodiments of the present disclosure.

FIG. 14 is a schematic diagram of a layout of the circuit in the netlist of the IC as illustrated in FIG. 10 in accordance with various embodiments of the present disclosure. FIG. 15 is a schematic diagram of a layout of the circuit in the netlist of the IC as illustrated in FIG. 11 in accordance with various embodiments of the present disclosure.

As illustratively shown in FIG. 14, there is a layout related to the semiconductor structure of the circuit in the netlist of the IC as shown in FIG. 10. Reference is now made to FIG. 10, there are three net 1, and the net 1 are connected together. Referring to the layout as shown in FIG. 14 which is related to the semiconductor structure of the circuit in the netlist of the IC as shown in FIG. 10, there is an internal net 1, and the internal net 1 connects all of the net 1 together. As illustratively shown in FIG. 15, it is a layout related to the semiconductor structure of the circuit in the netlist of the IC as shown in FIG. 11. Reference is now made to FIG. 11, there are net 1, net 2, net 3, and net 1, net 2, net 3 are separated. Referring to the layout as shown in FIG. 15 which is related to the semiconductor structure of the circuit in the netlist of the IC as shown in FIG. 11, there are also separated nets (now shown), and the nets are not connected together.

Since the layouts of the semiconductor structures of the circuits in the netlists of the ICs as shown in FIG. 14 and FIG. 15 are different, the routability, the parasitic resistance, the parasitic capacitance, the LDE, and other factors are therefore different. Hence, referring back to FIG. 2 and FIG. 3, when the parameters or the layouts of the PCells in the netlist of the IC are adjusted, the operation 223 is performed to re-trigger PCell callback for obtaining Layout Dependence Effect (LDE) and other factors from the operation 230 as shown in FIG. 2. The callback LDE and other factors together with the adjusted parameters or the adjusted layouts will be transmitted to the operation 223 as shown in FIG. 3, and the API is therefore executed to update the PCells in the netlist of the IC as illustrated in the operation 224. Due to the above-mentioned operations in FIG. 2 and FIG. 3, even if the layouts of the semiconductor structures of the circuits in the netlists of the ICs are changed, the corresponding LDE and other factors can be changed.

Figure 16:
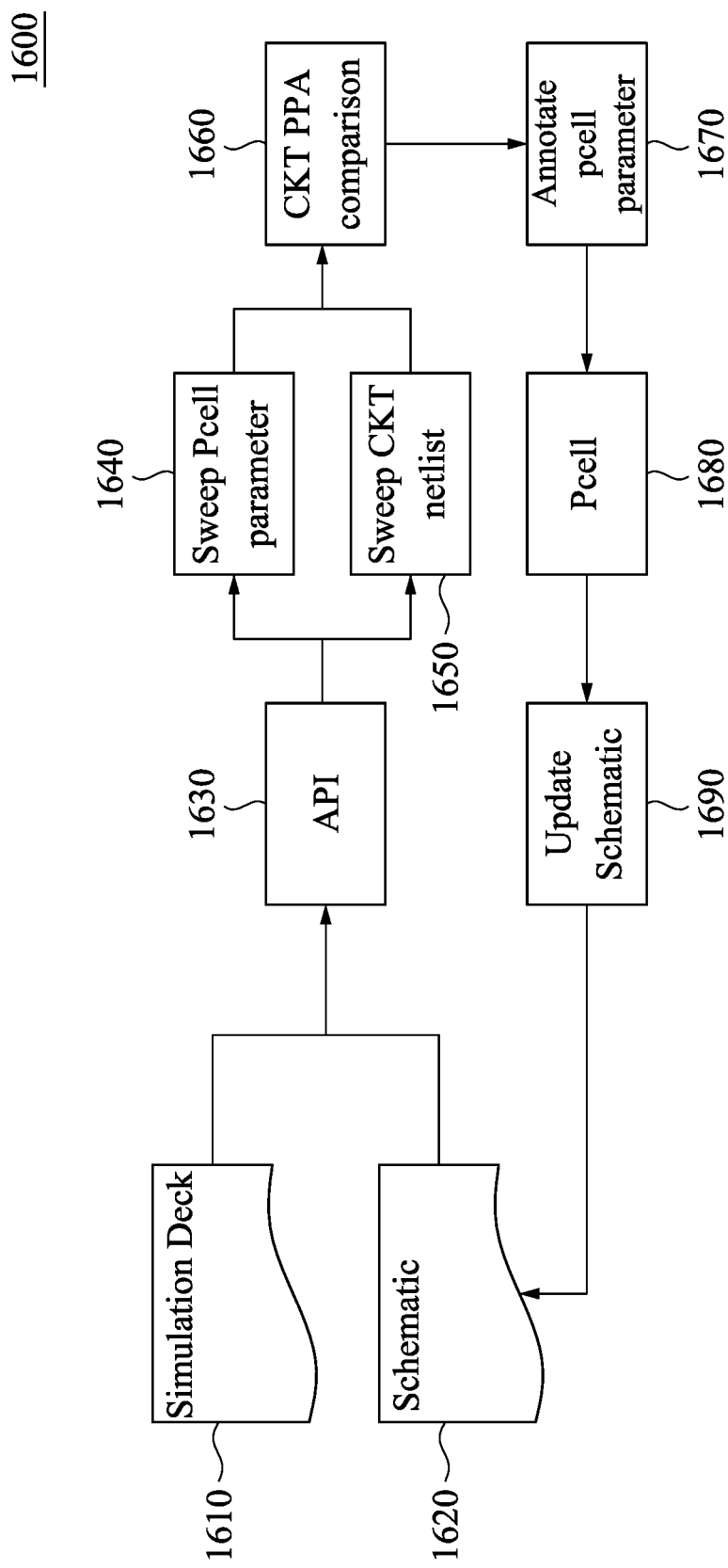
FIG. 16 is a flow diagram of a method for operating an EDA platform system in accordance with various embodiments of the present disclosure.

FIG. 16 is a flow diagram of a method 1600 for operating an EDA platform system in accordance with various embodiments of the present disclosure. As illustratively shown in FIG. 16, the EDA platform system 1600 is implemented by the processor 102 as illustratively shown in FIG. 1 to execute the instructions 106. The operation blocks marked as 1610, 1620, 1630, 1640, 1650, 1660, 1670, 1680, and 1690 are used to describe the operations that performed by the EDA platform system 1600 for facilitating the understanding of the EDA platform system 1600.

As illustratively shown in FIG. 16, an operation 1610 is performed to execute a simulation deck, and the simulation deck includes performance specification and other factors. An operation 1620 is performed to execute a schematic, and the schematic includes initial designs and initial PCell parameters. In some embodiments, the performance specification in the simulation deck and the initial designs, the initial PCell parameters in the schematic are able to be stored in the computer-readable storage medium 104 as illustratively shown in FIG. 1. The performance specification in the simulation deck and the initial designs, the initial PCell parameters in the schematic are then provided to the following operation 1630. The operation 1630 is performed to execute an API, and the API receives the performance specification in the simulation deck and the initial designs, the initial PCell parameters in the schematic.

Subsequently, an operation 1640 is performed to sweep the initial PCell parameters, and an operation 1650 is performed to sweep the CKT netlist. The swept PCell parameters and the swept CKT netlist change the performance of the circuit in the netlist of the IC, and an operation 1660 is therefore performed to do a Power, Performance, and Area (PPA) comparison for finding out whether the swept PCell parameters or the swept CKT netlist still conform the performance requirements. In some embodiments, the operation 1660 is to compare the performance of the swept PCell parameters or the swept CKT netlist with a predetermined performance. If the performance of the swept PCell parameters or the swept CKT netlist is higher than the predetermined performance, the swept PCell parameters or the swept CKT netlist conform the performance requirements.

Thereafter, the swept PCell parameters or the swept CKT netlist which conform the performance requirements is able to be found. It is noted that the above-mentioned operations are performed several times, and a plurality of the swept PCell parameters or the swept CKT netlist which conform the performance requirements are found. The operation 1660 is performed to further find out the best PCell parameters or the best CKT netlist among the swept PCell parameters and the swept CKT netlist which conform the performance requirements. The best PCell parameters or the best CKT netlist are regard as optimal PCell parameters, and an operation 1670 is performed to annotate the best PCell parameters or the best CKT netlist to be the optimal PCell parameters. Subsequently, an operation 1680 is performed to restructure the PCells according to the optimal PCell parameters which are annotated. An operation 1690 is performed to update the schematic. The updated schematic is then feedback to the operation 210 as illustratively shown in FIG. 2. Subsequently, after the operations 210-240 as illustratively shown in FIG. 2 are performed, the best simulation is found. The following operation 260 is then performed to generate a layout based on the simulation, and at least one component in a semiconductor device is fabricated based on the layout.

Also disclosed is a method. The method includes: adjusting first parameters associated with parameterized cells in a netlist of an integrated circuit (IC) to generate second parameters associated with the parameterized cells in the netlist of the IC; updating the netlist of the IC according to the second parameters; and performing a simulation according to the netlist.

In some embodiments, updating the netlist of the IC according to the second parameters includes: updating at least one element of a circuit in the netlist of the IC.

In various embodiments, updating the netlist of the IC according to the second parameters includes: updating parameters of a circuit in the netlist of the IC.

In some embodiments, the method further includes: obtaining a layout dependence effect according to the netlist which is adjusted, wherein updating the netlist of the IC according to the second parameters includes: updating the netlist of the IC according to the second parameters and the layout dependence effect.

In some embodiments, updating the netlist of the IC according to the second parameters includes: comparing a performance of the netlist of the IC with a predetermined performance; and if the performance of the netlist of the IC is higher than the predetermined performance, updating the netlist of the IC according to the second parameters.

In various embodiments, performing the simulation according to the netlist includes: performing the simulation according to the netlist whose performance is higher than the predetermined performance.

In some embodiments, the method further includes: generating a layout based on the simulation; and based on the layout, fabricating at least one component in a semiconductor device.

Also disclosed is a method. The method includes: providing, by an electronic design automation (EDA), a trigger signal to an application programming interface (API); providing, by the API, first parameters associated with parameterized cells in a netlist of an integrated circuit (IC); adjusting, by the API, the first parameters to generate second parameters associated with the parameterized cells in the netlist of the IC; updating, by the API, the netlist of the IC according to the second parameters; and performing, by the EDA, a simulation according to the netlist.

In some embodiments, updating, by the API, the netlist of the IC according to the second parameters includes: updating, by the API, at least one element of a circuit in the netlist of the IC.

In various embodiments, updating, by the API, the netlist of the IC according to the second parameters includes: updating, by the API, parameters of a circuit in the netlist of the IC.

In some embodiments, the method further includes: obtaining, by the API, a layout dependence effect according to the netlist which is adjusted.

In various embodiments, updating, by the API, the netlist of the IC according to the second parameters includes: updating, by the API, the netlist of the IC according to the second parameters and the layout dependence effect.

In some embodiments, updating, by the API, the netlist of the IC according to the second parameters includes: comparing, by the API, a performance of the netlist of the IC with a predetermined performance; and if the performance of the netlist of the IC is higher than the predetermined performance, updating, by the API, the netlist of the IC according to the second parameters.

In various embodiments, performing, by the EDA, the simulation according to the netlist includes: performing, by the EDA, the simulation according to the netlist whose performance is higher than the predetermined performance.

Also disclosed is a non-transitory computer readable medium. The non-transitory computer readable medium including computer executable instructions for carrying out a method. The method includes: adjusting first parameters associated with parameterized cells in a netlist of an integrated circuit (IC) to generate second parameters associated with the parameterized cells in the netlist of the IC; updating the netlist of the IC according to the second parameters; and performing a simulation according to the netlist.

In some embodiments, updating the netlist of the IC according to the second parameters includes: updating at least one element of a circuit in the netlist of the IC.

In various embodiments, updating the netlist of the IC according to the second parameters includes: updating parameters of a circuit in the netlist of the IC.

In some embodiments, the method further includes: obtaining a layout dependence effect according to the netlist which is adjusted.

In various embodiments, updating the netlist of the IC according to the second parameters includes: updating the netlist of the IC according to the second parameters and the layout dependence effect.

In some embodiments, updating the netlist of the IC according to the second parameters includes: comparing a performance of the netlist of the IC with a predetermined performance; and if the performance of the netlist of the IC is higher than the predetermined performance, updating the netlist of the IC according to the second parameters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
adjusting, by a processor, first parameters associated with parameterized cells in a netlist of an integrated circuit (IC) to generate second parameters associated with the parameterized cells in the netlist of the IC,
wherein at least one of the first parameters and at least one of second parameters correspond to a number of a plurality of elements that are coupled to each other in the parameterized cells and correspond to connection configurations of the plurality of elements;
updating, by the processor, the parameterized cells according to the second parameters;
updating, by the processor, the netlist of the IC according to the parameterized cells being updated; and
performing a simulation according to the netlist of the IC.

2. The method of claim 1, wherein the plurality of elements include a plurality of transistors of a circuit in the netlist of the IC, and
the plurality of transistors are coupled in parallel.

3. The method of claim 1, wherein updating the netlist of the IC comprises:
updating parameters of a circuit in the netlist of the IC.

4. The method of claim 1, further comprising:
obtaining a layout dependence effect according to the netlist of the IC which is adjusted;
wherein the parameterized cells are further updated according to the layout dependence effect.

5. The method of claim 1, wherein updating the netlist of the IC comprises:
comparing a performance of the netlist of the IC with a predetermined performance; and
if the performance of the netlist of the IC is higher than the predetermined performance, updating the netlist of the IC.

6. The method of claim 5, wherein performing the simulation according to the netlist of the IC comprises:
performing the simulation according to the netlist of the IC whose performance is higher than the predetermined performance.

7. The method of claim 1, further comprising:
generating a layout based on the simulation; and
based on the layout, fabricating at least one component in a semiconductor device.

8. A non-transitory computer readable medium, comprising computer executable instructions for carrying out a method, the method comprising:
adjusting first parameters associated with parameterized cells in a netlist of an integrated circuit (IC) to generate second parameters associated with the parameterized cells in the netlist of the IC,
wherein at least one of the first parameters and at least one of second parameters correspond to a number of a plurality of transistors that are stacked in the parameterized cells and correspond to connection configurations of the plurality of transistors;
updating the netlist of the IC according to the second parameters; and
performing a simulation according to the netlist of the IC.

9. The non-transitory computer readable medium of claim 8, wherein updating the netlist of the IC according to the second parameters comprises:
updating at least one element of a circuit in the netlist of the IC.

10. The non-transitory computer readable medium of claim 8, wherein updating the netlist of the IC according to the second parameters comprises:
updating parameters of a circuit in the netlist of the IC.

11. The non-transitory computer readable medium of claim 8, further comprising:
obtaining a layout dependence effect according to the netlist of the IC which is adjusted.

12. The non-transitory computer readable medium of claim 11, wherein updating the netlist of the IC according to the second parameters comprises:
updating the netlist of the IC according to the second parameters and the layout dependence effect.

13. The non-transitory computer readable medium of claim 8, wherein updating the netlist of the IC according to the second parameters comprises:
comparing a performance of the netlist of the IC with a predetermined performance; and if the performance of the netlist of the IC is higher than the predetermined performance, updating the netlist of the IC according to the second parameters.

14. A method, comprising:
before performing a simulation according to a netlist of an integrated circuit (IC), adjusting, by a processor, first parameters, being initial parameters, to generate second parameters associated with parameterized cells in the netlist of the IC,
wherein at least one of the first parameters and at least one of second parameters correspond to a number of a plurality of transistors included in at least one element in the parameterized cells and correspond to connection configurations of the plurality of transistors;
updating, by the processor, the netlist of the IC according to the second parameters; and
performing, by the processor, a simulation according to the netlist.

15. The method of claim 14, wherein updating the netlist of the IC comprises:
updating the at least one element of a circuit in the netlist of the IC.

16. The method of claim 14, wherein updating the netlist of the IC comprises:
updating parameters of a circuit in the netlist of the IC.

17. The method of claim 14, wherein updating the netlist of the IC comprises:
comparing a performance of the netlist of the IC with a predetermined performance; and
when the performance of the netlist of the IC is higher than the predetermined performance, updating the netlist of the IC.

18. The method of claim 17, wherein performing the simulation according to the netlist of the IC comprises:
performing the simulation according to the netlist of the IC whose performance is higher than the predetermined performance.

19. The method of claim 17, wherein updating the netlist of the IC comprises:
before the comparing, sweeping the second parameters associated with the parameterized cells in the netlist.

20. The method of claim 14, wherein updating the netlist of the IC comprises:
sweeping a circuit structure in the netlist of the IC;
comparing a performance of the netlist of the IC with a predetermined performance; and
when the performance of the netlist of the IC is higher than the predetermined performance, updating the netlist of the IC.

* * * * *